United States Patent
Linde

(10) Patent No.: US 10,674,649 B2
(45) Date of Patent: Jun. 2, 2020

(54) FIBER COMPOSITE COMPONENT

(71) Applicant: AIRBUS OPERATIONS GMBH, Hamburg (DE)

(72) Inventor: Peter Linde, Hamburg (DE)

(73) Assignee: Airbus Operations GmbH, Hamburg (DE)

( * ) Notice: Subject to any disclaimer, the term of this patent is extended or adjusted under 35 U.S.C. 154(b) by 0 days.

(21) Appl. No.: 16/418,565

(22) Filed: May 21, 2019

(65) Prior Publication Data

US 2019/0364700 A1 Nov. 28, 2019

(30) Foreign Application Priority Data

May 22, 2018 (DE) .......................... 10 2018 208 011

(51) Int. Cl.
*H05K 9/00* (2006.01)
*H05K 3/10* (2006.01)
*B32B 5/26* (2006.01)

(52) U.S. Cl.
CPC ............ *H05K 9/009* (2013.01); *H05K 3/103* (2013.01); *B32B 5/26* (2013.01); *B32B 2262/101* (2013.01); *B32B 2262/106* (2013.01); *B32B 2307/202* (2013.01); *B32B 2605/18* (2013.01); *H05K 2201/09236* (2013.01); *H05K 2201/10287* (2013.01)

(58) Field of Classification Search
CPC ..................... H05K 9/009; H05K 2201/09236
See application file for complete search history.

(56) References Cited

U.S. PATENT DOCUMENTS

| 5,648,137 A * | 7/1997 | Blackmore ............. B29C 33/06 428/102 |
| 8,351,220 B2 * | 1/2013 | Liang ...................... H01B 1/04 361/816 |
| 10,176,905 B2 * | 1/2019 | Fernandez ............. B32B 15/04 |
| 2011/0011627 A1 | 1/2011 | Aspas Puertolas |
| 2016/0207636 A1 * | 7/2016 | Yokoi ..................... B64C 1/061 |

(Continued)

FOREIGN PATENT DOCUMENTS

WO    WO 2005/114781 A2    12/2005

OTHER PUBLICATIONS

Asp et al., "Realisation of Structural Battery Composite Materials," 20th International Conference on Composite Materials, Copenhagen, Jul. 19-24, 11 pages (2015).

(Continued)

*Primary Examiner* — Hung V Ngo
(74) *Attorney, Agent, or Firm* — Jenkins, Wilson, Taylor & Hunt, P.A.

(57) ABSTRACT

A fiber composite component with integrated active electromagnetic shielding includes a fiber composite layer having reinforcing fibers, and an electric conductor, which extends on the fiber composite layer along the fiber composite layer and produces an electromagnetic field during operation, wherein a proportion of the reinforcing fibers is designed as conduction fibers, which are arranged to follow the electric conductor within the fiber composite layer and are designed to produce an opposing electromagnetic field during operation which attenuates the electromagnetic field of the electric conductor.

10 Claims, 1 Drawing Sheet

(56) References Cited

U.S. PATENT DOCUMENTS

2018/0139873 A1* 5/2018 Kim ..................... H05K 9/009

OTHER PUBLICATIONS

Leijonmarck et al., "Solid polymer electrolyte-coated carbon fibres for structural and novel micro batteries," Composites Science and Technology, vol. 89, ISSN 0266-3538, pp. 149-157 (2013).
German Search Report for Application No. 10 2018 208 011.9 dated Mar. 12, 2019.

* cited by examiner

Fig. 1
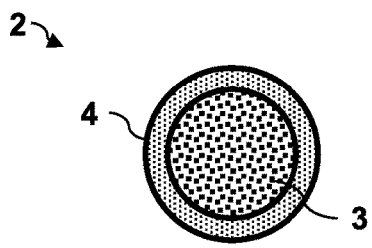
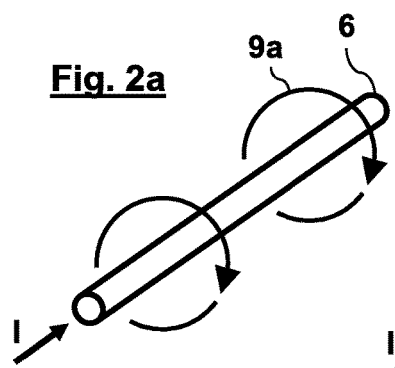
Fig. 2a
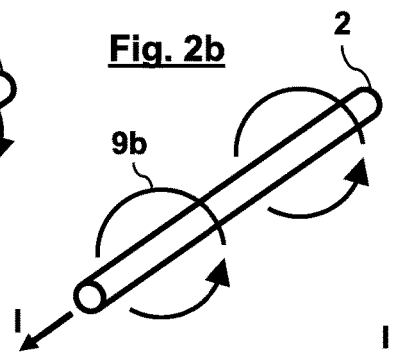
Fig. 2b
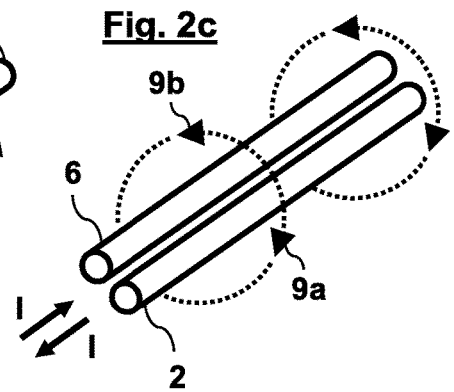
Fig. 2c
Fig. 3
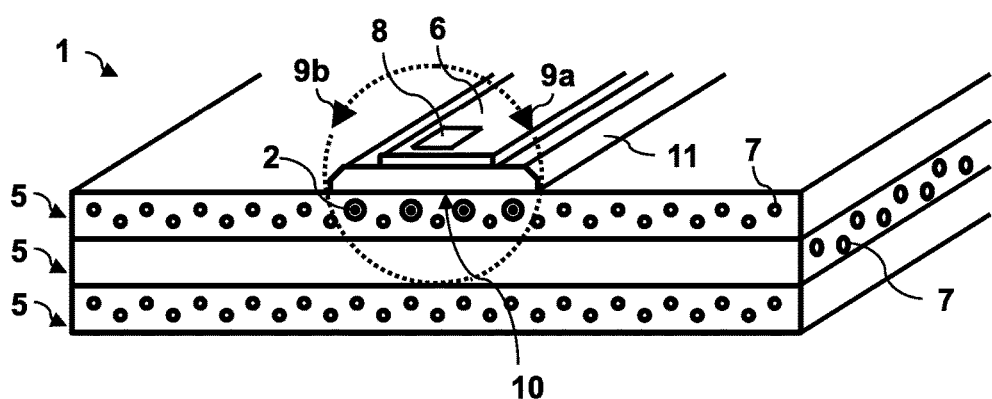
Fig. 4
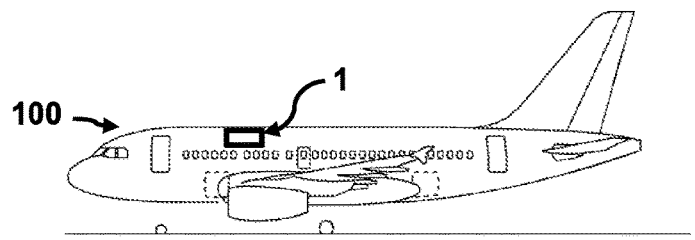

FIBER COMPOSITE COMPONENT

CROSS-REFERENCE TO RELATED APPLICATION

This application claims priority to German Patent Application 10 2018 208 011.9 filed May 22, 2018, the entire disclosure of which is incorporated by reference herein.

TECHNICAL FIELD

The disclosure herein relates to a fiber composite component with integrated active electromagnetic shielding.

BACKGROUND

Although it can be used in many applications, the disclosure herein and the problems underlying it are explained in greater detail in relation to passenger aircraft. However, the methods and devices described can likewise be used in different vehicles and in all sectors of the transport industry, e.g. for road vehicles, for rail vehicles, for aircraft or for watercraft.

In modern aircraft construction, structural components of aircraft are increasingly being manufactured from fiber composite materials. A fiber composite component of this kind can be produced, for example, by passing a multiplicity of reinforcing fibers, e.g. carbon fibers and/or glass fibers, through individual layers composed of a matrix material, e.g. a plastic and/or a metal, and then building up the layers and imparting to them a desired shape. To ensure the structural integrity of these components, both during production and in subsequent use, the components can be fitted with a multiplicity of sensors which detect relevant structural parameters, such as mechanical stress, temperature etc. In order to connect these sensors electrically and in terms of data engineering and to control them, a multiplicity of electric conductors and electronic components, even integrated circuits, can be installed on and/or in the fiber composite components. For example, integrated circuits can be applied to fiber composite materials with the aid of printing methods. In order to prevent unwanted mutual interference by electromagnetic fields, electronic elements of this kind can be integrated into shielding housings. Specifically in aircraft construction, however, it is desirable to keep the installation effort and, especially the weight, as low as possible.

The publications by Leijonmarck et al., "Solid polymer electrolyte-coated carbon fibers for structural and novel micro batteries," Composites Science and Technology, 89, 149-157, 2013 and Asp et al., "REALISATION OF STRUCTURAL BATTERY COMPOSITE MATERIALS," 20$^{th}$ International Conference on Composite Materials, Copenhagen, Jul. 19-24, 2015 describe the use of coated carbon fibers in structural batteries, i.e. batteries which are integrated into a fiber composite structure, e.g. that of a vehicle. The carbon fibers have a solid polymer electrolyte coating with a thickness of several hundred nanometres, which is applied by an electrochemical bath (a typical diameter of carbon fibers is about 6 to 7 micrometres). Among the effects of this coating is that of electric installation, wherein the fiber diameter is increased by only about one micrometre by the coating.

SUMMARY

Given this background situation, it is an underlying object of the disclosure herein to find improved solutions for shielding electric conductors on fiber composite components.

According to the disclosure herein, this object is achieved by a fiber composite component having features disclosed herein.

Accordingly, a fiber composite component with integrated active electromagnetic shielding is provided. The fiber composite component comprises a fiber composite layer having a multiplicity of reinforcing fibers, and an electric conductor, which extends on the fiber composite layer along the fiber composite layer and produces an electromagnetic field during operation, wherein a proportion of the reinforcing fibers is designed as conduction fibers, which are arranged to follow the electric conductor within the fiber composite layer and are designed to produce an opposing electromagnetic field during operation which attenuates the electromagnetic field of the electric conductor.

An aircraft or spacecraft having a fiber composite component according to the disclosure herein is furthermore provided.

A concept underlying the disclosure herein is that of using fibers simultaneously as reinforcing fibers of a fiber composite component and as electric conduction fibers for producing opposing electromagnetic fields in order actively to attenuate or even compensate electromagnetic interference fields of conductors on the fiber composite component. Increased power consumption is thus consciously accepted in order to avoid sheathing or other shielding that increases the weight and installation volume. Moreover, active shielding which can address current operating conditions or operating requirements at any time is provided. In particular, the disclosure herein offers advantages for modern production methods for fiber composite components, such as automated fiber placement (AFP) or the like. In such methods, thin fiber-reinforced tapes with or without a plastic matrix or other materials are laid on a tool surface along a predetermined path with the use of pressure and temperature by a placement head, which can be robot-guided. During this process, it is possible, in particular, for the fiber composite tapes to be placed in a curved shape on the placement surface, e.g. by aligning the tapes along a predetermined path by the pressure of a placement roller and the existing material stress. AFP methods thus offer high flexibility in respect of the alignment of the individual fibers, and therefore even complex arrangements can be formed from individual fibers.

Advantageous embodiments and developments will emerge from the further dependent claims and from the description with reference to the figures.

According to a development, the conduction fibers can be designed to substantially compensate the electromagnetic field of the conductor. In embodiments, it is possible, for example, to make provision for a current through the conduction fibers to be controlled in such a way that the electric field of the conductor to be shielded is attenuated to a certain extent and, where applicable, almost completely compensated. The conduction fibers can extend substantially parallel to the electric conductor, for example. Moreover, the conduction fibers can be positioned as close as possible to the electric conductor.

According to a development, the conduction fibers can each be designed as carbon fibers with an electrically insulating coating. Owing to the electrically insulating coating of the conduction fibers, leakage currents or similar effects can be significantly reduced or even completely avoided since the fibers can now readily touch each other without the possibility of a leakage current or even a short circuit occurring. It is thereby possible to minimize and very largely avoid electric losses. Such coatings of carbon fibers can be mass-produced at relatively low cost and in a manner which is efficient in terms of time. Coated carbon fibers can as it were form a natural part of a fiber composite component without leading to discontinuities or electrochemical reactions. The electrically insulating coating selected can furthermore be optimized in such a way that there is no impairment of the bonding behaviour, i.e. the conduction fibers have a similar bonding behaviour to uncoated carbon fibers.

According to a development, the insulating coating can be a polymer coating. The electrically insulating coating can be designed as a polymer electrolyte coating, in particular as a solid polymer electrolyte coating. Polymer electrolyte coatings of this kind offer outstanding bonding properties for incorporation into fiber-reinforced components.

According to a development, the conduction fibers can be arranged in the form of individual fibers, bundles and/or tapes. In principle, the conduction fibers can be arranged or integrated in various different forms known to those skilled in the art, of the kind known from the manufacture of fiber composite components in general.

According to a development, the electric conductor can be electrically insulated from the fiber composite layer by an insulating layer. In this case, the insulating layer prevents short circuits and leakage currents between the electric conductors and those regions of the fiber composite component which are situated underneath the conductor.

According to a development, the conduction fibers can extend at least over a bearing region of the conductor. If the conduction fibers extend over the entire bearing region of the conductor or can cover the conductor in sufficient density, it is possible to dispense with an additional insulating layer between the electric conductor and the fiber composite layer since even an electrically insulating coating of the conduction fibers may be sufficient to insulate the electric conductor.

According to a development, the conductor can be part of an integrated circuit on the fiber composite layer. In this case, the conduction fibers can be arranged and designed to attenuate or even compensate electromagnetic fields of a part or of the whole of the integrated circuit.

According to a development, the fiber composite component can furthermore have a control device. The control device can be designed to control an electric current through the conduction fibers in accordance with an electric current through the conductor. For example, the control device can comprise a microcontroller or the like, which can be designed to match the current through the conduction fibers to the current through the electric conductor. For example, the electric conductor can be part of an integrated circuit which is connected for communication with the control device. Alternatively, the control device can be integrated into the integrated circuit.

The above embodiments and developments can be combined in any desired manner, insofar as this is feasible. Further possible embodiments, developments and implementations of the disclosure herein also include combinations, not explicitly mentioned, of features of the disclosure herein that have been described above or are described below with reference to the illustrative embodiments. In this context, a person skilled in the art will, in particular, also add individual aspects as improvements or additions to the respective basic form of the disclosure herein.

BRIEF DESCRIPTION OF THE DRAWINGS

The disclosure herein is explained in greater detail below by the illustrative embodiments depicted in the schematic figures. Here:

FIG. 1 shows a schematic cross-sectional view of a line fiber comprising a fiber composite component according to one embodiment of the disclosure herein;

FIGS. 2a-c show schematic views of conductors and conduction fibers through which electric currents flow;

FIG. 3 shows a schematic perspective sectional view of a fiber composite component according to one embodiment of the disclosure herein having the conduction fiber from FIG. 1; and FIG. 4 shows a schematic side view of an aircraft having the fiber composite component from FIG. 3.

DETAILED DESCRIPTION

The attached figures are intended to impart a greater understanding of the embodiments of the disclosure herein. They illustrate embodiments and, together with the description, serve to explain principles and concepts of the disclosure herein. Other embodiments and many of the advantages mentioned will become apparent from the drawings. The elements of the drawings are not necessarily shown to scale in relation to one another.

In the figures of the drawing, identical, functionally identical and identically acting elements, features and components are each provided with the same reference signs, unless explicitly stated otherwise.

FIG. 1 shows a schematic cross-sectional view of a line fiber 2 comprising a fiber composite component 1 according to one embodiment of the disclosure herein. The fiber composite component 1 is depicted in a perspective sectional view in FIG. 3. In a specific use, the fiber composite component 1 can be, for example, a structural component of an aircraft 100, e.g. of a passenger aircraft of the kind that can be seen by way of example in FIG. 4.

The fiber composite component 1 comprises a plurality of fiber composite layers 5, which each have a multiplicity of reinforcing fibers 7. The reinforcing fibers 7 can each be arranged in parallel in the fiber composite layers 5 with an alignment which alternates between the fiber composite layers 5. Purely by way of example, FIG. 3 depicts three fiber composite layers 5, of which the reinforcing layers 7 in a central fiber composite layer 5 are aligned at right angles to the reinforcing fibers 7 in the two surrounding fiber composite layers 5. On the uppermost fiber composite layer 5 there is an electric conductor 6, which extends on the fiber composite layer 5 along the fiber composite layer 5 and rests on the fiber composite layer 5 on a bearing region 10 via an insulating layer 11. The electric conductor 6 can be part of an integrated circuit, for example. Alternatively, however, it can likewise be a matter here of an individual line, e.g. a power line or a signal transmission line.

Directly below the bearing region 10, the reinforcing fibers 7 are designed as conduction fibers 2, which form an active electromagnetic shield for the fiber composite component 1. For this purpose, each conduction fiber 2 comprises a carbon fiber 3, which is provided with an electrically insulating coating 4 (cf. FIG. 1). In this case, the carbon fibers 3 form an electrically conductive core of the conduction fiber 2, through which a current I can be passed to produce an electromagnetic field. The electrically insulating coating 4 is designed as a solid polymer coating, e.g. a polymer electrolyte coating. An electrochemical coating of this kind can be produced by dipping the carbon fiber 3 into a suitable electrochemical bath, for example. By way of example, the carbon fiber 3 can have a diameter of between 6 and 7 micrometres. A solid polymer coating of this kind can be made very thin, e.g. with a thickness of 0.5 micrometres, giving a total diameter of the conduction fiber 2 of about 7 to 8 micrometres. The required installation volume of such a conduction fiber 2 is thus virtually no different from that of an uncoated carbon fiber.

The conduction fiber 2 has similar properties to a conventional carbon fiber from a structural point of view and also in respect of its compatibility with fiber composite material. For this reason, it can readily be used as a reinforcing fiber in fiber composite components, or integrated into the latter, without the occurrence of unwanted reactions. On the other hand, the solid polymer coating is designed as an electric insulator, which can electrically insulate a conduction fiber 2 from other conduction fibers 2 without the occurrence of leakage flows and/or short circuits between several adjacent conduction fibers 2 through which a current is flowing. Moreover, a conduction fiber 2 of this kind can be designed to have high-grade temperature stability.

During operation, the electric conductor 6 produces an electromagnetic field 9a, the field lines of which extend around the electric conductor 6, as can be seen in FIG. 2a. Here, the electric conductor 6 is illustrated in a purely schematic way as a conductor in the shape of a cylindrical bar, through which a constant current I flows, i.e. circular magnetic field lines, the alignment of which can be determined from the Maxwell equations or from the right-hand rule derived therefrom, are obtained. FIG. 2b shows a conduction fiber 2, which is aligned parallel to the electric conductor 6 and through which an opposite current I of the same magnitude flows. In corresponding fashion, an opposing electromagnetic field 9b is obtained. If the two components are arranged next to one another, the electromagnetic field 9a and the opposing electromagnetic field 9b approximately compensate each other, as indicated in FIG. 2c, since the magnetic fields are of approximately equal magnitude but oppositely aligned.

In the embodiment of the fiber composite component 1 in FIG. 3, this principle is used to provide active electromagnetic shielding of the electric conductor 6. For this purpose, at least those reinforcing fibers 7 which are arranged directly adjacent to the insulating layer 11 in the bearing region 10 are designed as conduction fibers 2. The conduction fibers 2 are arranged parallel to the electric conductor 6 within the uppermost fiber composite layer 5, below the entire bearing region 10. In this case, the conduction fibers 2 are designed to produce an opposing electromagnetic field 9b during operation, which attenuates the electromagnetic field 9a of the electric conductor 6 or, where applicable, even approximately compensates it. For example, an electric current can flow into the figure through the electric conductor 6, while an opposing current can flow out of the figure through the conduction fibers 2, as a result of which the electromagnetic field 9a and the opposing electromagnetic field 9b cancel each other out, given appropriate choice of currents and of conductor or fiber geometries.

For this purpose, the fiber composite component 1 comprises a control device 8, e.g. a microcontroller, which is coupled to the electric conductor 6 and to the conduction fibers 2 and is designed to control an electric current through the conduction fibers 2 in accordance with an electric current through the electric conductor 6. Through appropriate setting of the electric current through the conduction fibers 2, a suitable shielding effect with partial or complete attenuation of the electromagnetic field 9a of the electric conductor 6 can be achieved at any time. Since the fields or currents which typically occur during this process are relatively small, the power requirement of the aircraft 100 is not significantly affected. At the same time, however, electric conductors 6 can be effectively shielded without the occurrence of additional weight or the need to free up any significant installation volume. On the contrary, reinforcing fibers 7 of the fiber composite can perform an additional function as active shielding components. It is thus possible to save weight, installation volume and, ultimately, costs.

In this case, the specific arrangement shown in FIG. 3, comprising conduction fibers 2 and the electric conductor 6, should be understood to be purely schematic. The relevant person skilled in the art will design the conduction fibers 2 and the electric conductor 6 in an appropriately advantageous manner in order to achieve the desired result. For example, the electric conductor 6 can be part of a system for structural monitoring of the fiber composite component 1 and can be designed accordingly. In terms of their geometry, their electrical properties, their alignment and/or their number, the conduction fibers 2 can be designed in such a way that electromagnetic fields 9a of the electric conductor 6 are attenuated and/or approximately compensated as soon as a suitable current is passed through the conduction fibers 2.

In the preceding detailed description, various features have been combined in one or more examples to improve the conciseness of the illustration. However, it should be clear here that the above description is of a merely illustrative and in no way restrictive nature. It serves to cover all the alternatives, modifications and equivalents of the various features and illustrative embodiments. Many other examples will be immediately and directly clear to a person skilled in the art from a consideration of the above description on the basis of their specialist knowledge.

For example, the insulating layer 11 in FIG. 3 can be omitted in alternative embodiments in which the conduction fibers 2 run below the bearing region 10 of the electric conductor 6 in sufficient density and with sufficient coverage, with the result that the conduction fibers 2 effectively form an insulating layer by virtue of their electrically insulating coating.

The illustrative embodiments have been selected and described in order to explain as well as possible the principles underlying the disclosure herein and the possible applications thereof in practice. This will enable those skilled in the art to modify and use the disclosure herein and the various illustrative embodiments thereof in an optimum manner for the intended purpose. In the claims and in the description, the terms "including" and "having" are used as linguistically neutral concepts for the corresponding term "comprising". Furthermore, use of the terms "a" and "an" is not intended in principle to exclude a plurality of features and components described as such.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a", "an" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

LIST OF REFERENCE SIGNS 1 fiber composite component
2 conduction fiber 3 carbon fiber
4 electrically insulating coating
5 fiber composite layer
6 electric conductor
7 reinforcing fiber
8 control device
9a electromagnetic field
9b opposing electromagnetic field
10 bearing region
11 insulating layer
100 aircraft
I electric current

The invention claimed is:

1. A fiber composite component with integrated active electromagnetic shielding, comprising:
    a fiber composite layer having a plurality of reinforcing fibers; and
    an electric conductor, which extends on the fiber composite layer along the fiber composite layer and is configured to produce an electromagnetic field during operation;
    wherein a proportion of the reinforcing fibers are conduction fibers arranged to follow the electric conductor within the fiber composite layer and to produce an opposing electromagnetic field during operation, the opposing electromagnetic field opposing the electromagnetic field generated by the electric conductor, and the opposing electromagnetic field is configured to attenuate the electromagnetic field of the electric conductor.

2. The fiber composite component according to claim 1, wherein the conduction fibers are configured to substantially compensate the electromagnetic field of the electric conductor.

3. The fiber composite component according to claim 1, wherein the conduction fibers are each carbon fibers with an electrically insulating coating.

4. The fiber composite component according to claim 3, wherein the insulating coating is a polymer coating.

5. The fiber composite component according to claim 1, wherein the conduction fibers are arranged in a form of at least one of the group consisting of individual fibers, bundles and tapes.

6. The fiber composite component according to claim 1, wherein the electric conductor is electrically insulated from the fiber composite layer by an insulating layer.

7. The fiber composite component according to claim 1, wherein the conduction fibers extend at least over a bearing region of the electric conductor.

8. The fiber composite component according to claim 1, wherein the electric conductor is part of an integrated circuit on the fiber composite layer.

9. The fiber composite component according to claim 1, comprising a control device configured to control an electric current through the conduction fibers in accordance with an electric current through the electric conductor.

10. An aircraft or spacecraft having a fiber composite component according to claim 1.

* * * * *